United States Patent [19]

George

[11] 4,262,365
[45] Apr. 14, 1981

[54] RFI SHIELD FOR AN IR INPUT CIRCUIT

[75] Inventor: John B. George, Indianapolis, Ind.

[73] Assignee: RCA Corporation, New York, N.Y.

[21] Appl. No.: 88,658

[22] Filed: Oct. 29, 1979

[51] Int. Cl.³ .............................................. H04B 1/10
[52] U.S. Cl. ...................... 455/603; 333/12;
350/1.1; 350/319; 250/338; 455/300; 455/619
[58] Field of Search .................. 333/12; 358/245, 253,
358/254; 455/300, 301, 602, 603, 619; 350/1.1,
319; 361/399

[56] References Cited

U.S. PATENT DOCUMENTS

| | | |
|---|---|---|
| 2,366,224 | 1/1945 | Warp . |
| 2,442,909 | 12/1949 | Warp . |
| 3,153,172 | 10/1964 | Ling. |

FOREIGN PATENT DOCUMENTS 2247681  4/1974  Fed. Rep. of Germany ........... 455/301

OTHER PUBLICATIONS

Terman, *Measurements in Radio Engineering*, McGraw-Hill, 1935, p. 342, FIG. 187.

*Primary Examiner*—Paul L. Gensler
*Attorney, Agent, or Firm*—Eugene M. Whitacre; Paul J. Rasmussen; Peter M. Emanuel

[57] ABSTRACT

A thin metal RFI (radio frequency interference) shield for an IR (infra-red) input circuit including an IR transducer for a remote control receiver has slot-like apertures with louver-like members formed by twisting the metal between the slot-like apertures substantially 90° with respect to the surface of the housing. The louvers compensate for the absence of shielding material in the apertures and thereby improve the RFI shielding effectiveness of the shield. The louver-like members also have been found to expand the field of reception or field of the remote control receiver by reflecting IR radiation coming from sideward positions into the IR transducer.

5 Claims, 5 Drawing Figures

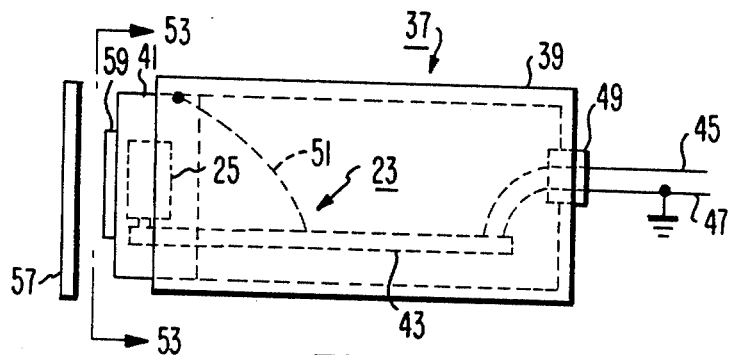
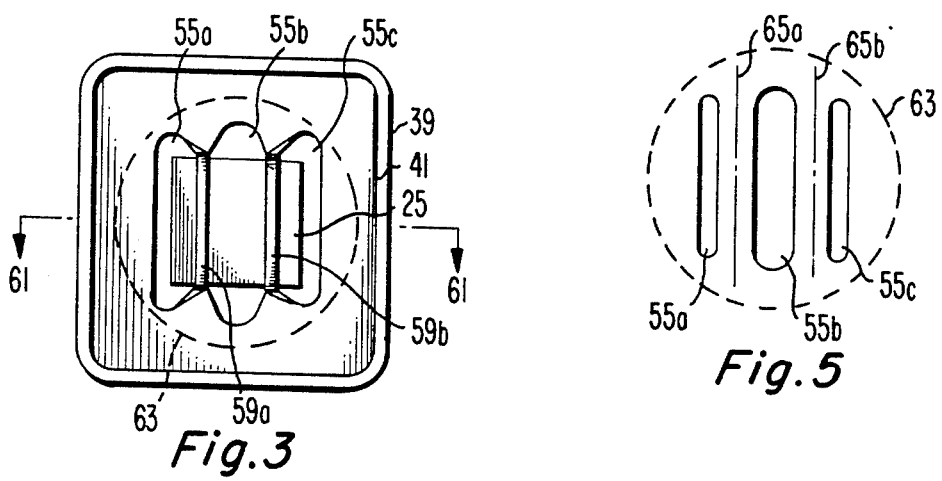
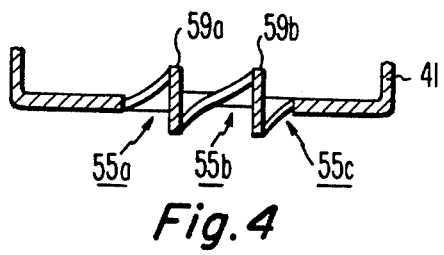

RFI SHIELD FOR AN IR INPUT CIRCUIT

BACKGROUND OF THE INVENTION

The present invention concerns an RFI (radio frequency interference) shield for and IR (infra-red) transducer.

Since input circuits including an IR transducer for converting IR radiation to corresponding electrical signals operate at low signal levels, they are susceptible to RFI caused by electromagnetic radiation in undesired frequency ranges. While the circuits may be to some degree designed to reject electrical signal due to RFI, such circuits tend to be too expensive for use in consumer products. As an alternate to RFI rejection circuitry some form of grounded metal RFI shield may be employed.

The shielding effects of an RFI shield for an IR input circuit is limited due to the aperture(s) necessary for the reception of IR radiation. To partially cure this problem, a metal screen or mesh may be placed over the aperture(s) of a RFI shield. The metal screen permits IR radiation to reach the IR transducer and tends to, at least partially, provide some RFI shielding in the area of the aperture. Unfortunately, the two piece construction of metal shield and screen is expensive. Moreover, the two piece construction is subject to the degradation of the electrical contact between the screen and metal shield which tends to reduce its RFI shielding effectiveness.

SUMMARY OF THE PRESENT INVENTION

The present invention concerns a thin metal RFI shield for an IR input circuit in which at least one louver-like member is formed between aperture slots for an IR transducer. The surface area of the louver-like member compensates for the absence of metal in the apertures and, as a result, tends to improve the RFI shielding properties compared to a conventional RFI shield having aperture(s) of approximately the same dimension. It has also been found that the louver-like members increase the angle or field of IR reception if the louver-like member is twisted substantially 90° with respect to the surface of the shield and the shield is positioned so that the louver-like member is substantially perpendicular to the plane of the desired major field of IR reception by the transducer.

BRIEF DESCRIPTION OF THE DRAWING

FIGS. 2, 3, 4 and 5 are various views of a shield container for an IR remote control receiver constructed in accordance with the present invention.

DETAILED DESCRIPTION OF THE PRESENT INVENTION

Figure 1:
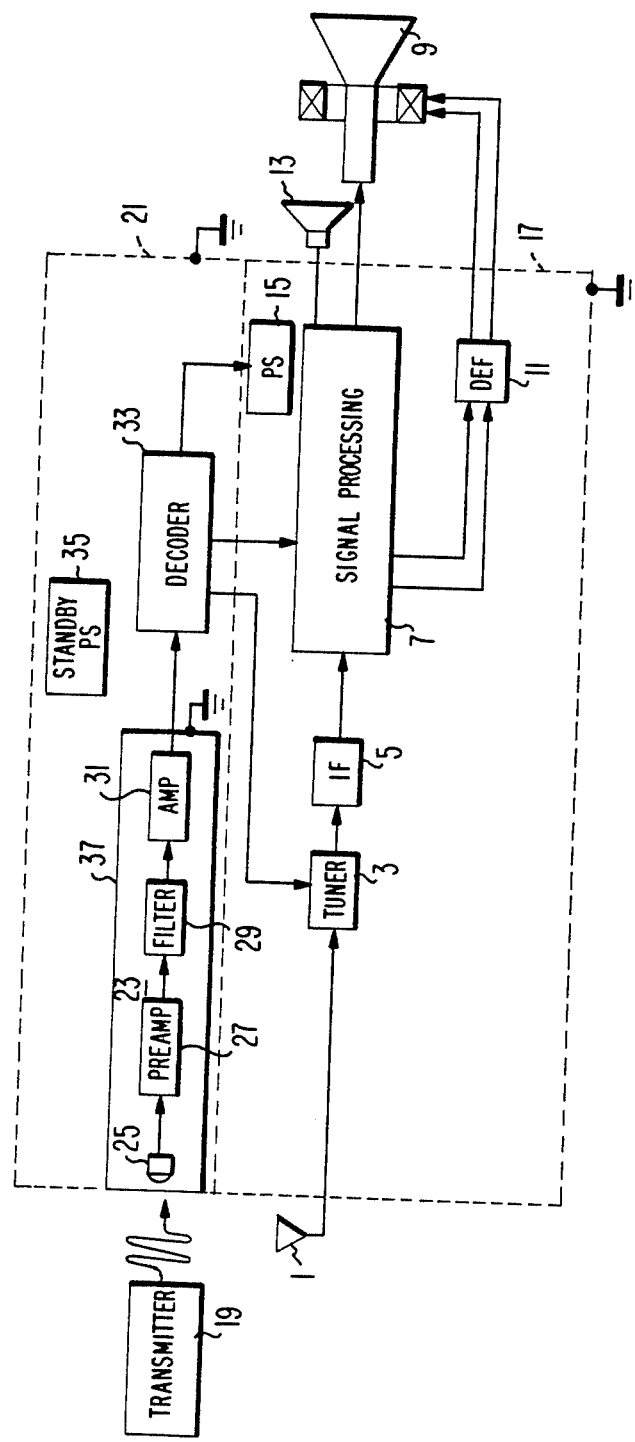
FIG. 1 is a schematic diagram of a television receiver employing an IR remote control apparatus which is useful in facilitating and understanding of the present invention.

Referring to FIG. 1, an antenna 1 provides RF carriers to a tuner 3 of a television receiver. Tuner 3 tunes the particular RF carrier for selected channel and heterodynes it with a local oscillator signal having a frequency adjusted for the selected channel to derive an IF signal. The IF signal is filtered and amplified by an IF processing unit 5. The IF signal has luminance, color, synchronization, and sound components. A signal processing unit 7 processes the luminance and color components to generate video drive signals. A picture tube 9 generates electron beams in response to the video drive signals. Signal processing unit 7 also separates vertical and horizontal synchronization components from the IF signal. The vertical and horizontal synchronization components are processed by a deflection unit 11 to generate vertical and horizontal deflection signals for sweeping the electron beams generated by picture tube 9 in a raster fashion to form an image. Signal processing unit 7 also processes the sound components of the IF signal to generate an audio drive signal for a speaker 13. A power supply 15 provides operating voltages for the portions of an electronic chassis 17 in which the portions of the receiver so far described are housed.

The various functions of the receiver, e.g., power "on" and "off" control, channel selection, and sound level, are remotely controllable by means of a remote control system comprising an IR transmitter 19 and IR receiver 21. IR transmitter 19 emits IR carriers modulated by function command signals generated in response to the operation of respective keys or buttons (not specifically shown).

IR receiver 21 includes an input circuit 23 for processing received IR radiation. An IR transducer 25 converts the received IR radiation to corresponding electrical signals. Transducer 25 may comprise a light sensitive diode, such as a type SHF 205 diode manufactured by Siemens, A. G. of West Germany, having a peak amplitude response at a wavelength of 950 nanometers. The electrical signal is amplified by a preamplifier 27, filtered by a noise filter and further amplified by an amplifier 31. The processed electrical signal is decoded by a decoder 31 to derive command signals for controlling respective functions of the receiver. A standby power supply 35, which is "on" even while power supply 15 is "off", provides operating voltages to the various portions of remote control receiver 21.

Portions of the receiver generate signal having frequency components which are high enough to be radiated to and interfere with the operation of input circuit 23 of IR remote control receiver 21. E.g., the horizontal deflection signal, having a fundamental component at 15.734 KHz, has harmonic components which may be coupled to input circuit 23 and amplified by preamplifier 27 along with the desirable IR related signals generated by transducer 25. The harmonic components of the horizontal deflection signal radiated to input circuit 23 may be combined by nonlinear circuit elements of preamplifier 25 to form other undesired signal components. Unfortunately, noise filter 29, having a rejection band of, e.g., 40 KHz ± 500 Hz, is incapable of removing all of the undesired signal components which may obscure the desired IR related signals. To inhibit undesired RFI related signals due to the radiation of harmonic components of the horizontal deflection signal as well as other electrical signals from reaching input circuit 23 and thereby interfering with the operation of remote control receiver 21, a grounded metal shield container or housing 37 substantially surrounds input circuit 23.

Shield container 37, as illustrated in the side elevation of FIG. 2, includes a metal body 39 and a metal cap 41 inserted in the body to form a closed container. Both body 39 and cap 41 are formed from thin metal sheets to have square cross sections. Cap 41 is made to fit snugly within body 39 and includes dimples (not shown) which mate with detents (not shown) in body 39 so as to provide good electrical contact between cap 41 and body 39. Input circuit 23 is formed on a printed circuit board 43 within shield container 37 (by means not shown). For the sake of simplicity, only transducer 25 of input circuit 23 is shown mounted on circuit board 43. Wires 45 and 47 pass through a grommet 49 at the rear of shield container 39 and connect the output of input circuit 25 to the input of decoder 33 and the signal ground line of input circuit 25 to a signal ground point of the receiver, respectively. A wire 51 connects cap 41 to the signal ground line of input circuit 25.

The front of shield container 37 is shown in FIG. 3 which is a view taken in the direction of section lines 53 of FIG. 2. As is shown, apertures in the form of slots 55a–55c are formed in cap 51. Transducer 25 is positioned (by means not shown) to receive light through slots 55a–55c. Since it is desired that transducer 25 receive only IR radiation, an optical filter 57 having a bandpass between 925 and 975 nanometers is placed in front of cap 41. A translucent sheet of Lexan deep purple in color and approximately 1 millimeter thick has been found suitable as filter 57.

While apertures in a RFI shield are necessary to permit IR radiation to reach an IR transducer, they reduce the RFI shielding effectiveness. In the present shielding arrangement, however, louver-like members 59a and 59b are formed between slots 55a and 55b and between slots 55b and 55c, respectively, to improve the RFI shielding effectiveness without reducing the amount of received IR radiation compared with a shielding arrangement having the same dimensions and apertures of the same form factor and size. Moreover, it has been found that louver-like members 59a and 59b tend to increase the field of remote control receiver 21, i.e., the angle from which IR radiation may be received by receiver 21. The cross-sectional view of FIG. 4 taken in the direction of section lines 61 of FIG. 3 illustrate louver-like members 59a and 59b more clearly.

The formation of louver-like members 59a and 59b may be understood by reference to FIG. 5 which is a detail view of portion 63 of cap 41 before the formation of louver-like members 59a and 59b. As shown, three oval slots 55a, 55b, 55c are die-cut in the sheet metal which comprises cap 41. The areas between slots 55a and 55b and 55b and 55c are twisted about axis 65a and 65b to form louver-like members 59a and 59b respectively. Preferably, for the reasons explained below, the areas between slots 55a and 55b and 55b and 55c are twisted so that louver-like members 59a and 59b are substantially 90° with respect to the plane of the sheet metal. Cap 41 may be formed before or after the formation of louver-like members 59a and 59b. Although louver-like members 59a and 59b are for the most part substantially flat, it will be understood that the areas at their ends which meet the plane of the sheet metal are slightly curved.

With respect to the shielding properties of shield container 37, the surface area of louver-like members 59a and 59b compensates for the absence of metal in slots 55a, 55b and 55c. It is believed, that capacitances are formed between louver-like members 59a and 59b and various conductor portions of input circuit 25 which attenuate electrical signal derived from RFI. Since louver-like members 59a and 59b are an integral part of cap 41, there are substantially no electrical contact problems normally associated with two piece shield construction such as those employing a separate screen to cover an aperture. Moreover, a screen covering slots 55a–55c with mesh openings small enough to provide comparable shielding would have a tendency to inhibit IR radiation from reaching transducer 25.

As earlier noted, louver-like members 59a and 59b tend to improve the IR reception characteristic receiver 21 by increasing the field of IR reception of remote control receiver 21 in planes perpendicular to the longitudinal dimension of louvers 59a and 59b by reflecting IR radiation from sideward positions into transducer 25. To enhance this feature, it is desirable to select the metal of cap 41 or treat its surface to reflect IR radiation. E.g., sheet metal with a shiny finish has been found suitable for this purpose. In a television receiver shield container 37 should be oriented so that louvers 59a and 59b are substantially vertical so as to enable users to control the receiver from relatively wide angles sideward of the receiver.

Typical specifications of cap 41 before louvers 59a and 59b are formed, for use with a SHF 205 diode manufactured by Siemens, A.G. of West Germany as IR transducer 25 are:

| material | tin plated steel |
|---|---|
|  | 0.016 inches thick |
| length of slot apertures all | 0.3 inches |
| width of slot apertures |  |
| two end apertures | 0.03 inches |
| middle aperture | 0.06 inches |
| distance between the axis of the outer apertures and the axis of the inner aperture | 0.125 inches |

While the present shielding arrangement has been described as having three slot apertures and two louver-like members, it will be appreciated that other numbers of apertures and louver-like members may be employed. These and other modifications are intended to be within the scope of the present invention as defined by the following claims.

What is claimed is:

1. An RFI shield for a circuit including an IR transducer for converting IR radiation to corresponding electrical signals, comprising:
   a thin metal housing surrounding at least a portion of said circuit and having at least two slot-like apertures formed side by side, said slot-like apertures positioned and dimensioned with respect to said IR transducer to permit IR radiation to reach said transducer; and
   a louver-like member formed by twisting the portion of said housing between said slot-like apertures.

2. The apparatus recited in claim 1 wherein:
   said louver-like members are, in cross-section, substantially 90° to the surface of said housing.

3. The apparatus recited in claim 2 wherein:
   said material of said housing is selected to reflect IR radiation.

4. Apparatus, comprising:
   transmitter means for generating IR radiation;
   circuit means including a transducer for converting IR radiation to corresponding electrical signals;
   utilization means for performing predetermined functions in response to said electrical signals, said utilization means including a point of reference potential;
   a thin metal housing surrounding at least a portion of said circuit including said transducer, said housing being connected to said point of reference potential, said sheet metal being selected to reflect IR radiation, said housing having at least two slot-like apertures positioned and dimensioned with respect to said transducer to permit IR radiation to reach said transducer; and a louver-like member formed by twisting the portion of said housing between said slot-like apertures to form an angle of substantially 90° between said louver-like member and the surface of said housing, said housing being positioned to provide a major field of reception of IR radiation for said transducer in a plane substantially perpendicular to the longitudinal dimension of said louver-like member.

5. The apparatus recited in claim 4 wherein:

said utilization means includes signal processing circuits of a television receiver; and said housing is positioned so that the longitudinal dimension of said louver-like member is substantially vertical.

* * * * *